United States Patent [19]
Lin et al.

[11] Patent Number: 5,796,141
[45] Date of Patent: Aug. 18, 1998

[54] COMPACT CONTACTLESS TRENCHED FLASH MEMORY CELL

[75] Inventors: Ruei-Ling Lin, Hsiung; Ching-Hsiang Hsu; Gary Hong, both of Hsinchu, all of Taiwan

[73] Assignee: United Microelectronics Corporation, Taiwan

[21] Appl. No.: 784,588

[22] Filed: Jan. 23, 1997

[30] Foreign Application Priority Data

May 31, 1996 [TW] Taiwan ................................ 85106472

[51] Int. Cl.$^6$ ................................................ H01L 29/788
[52] U.S. Cl. ........................ 257/316; 257/318; 365/185.33
[58] Field of Search ............................ 257/316, 318, 257/321, 510; 365/185.33

[56] References Cited

U.S. PATENT DOCUMENTS 5,075,245  12/1991  Woo et al. ................................ 437/43
5,617,351  4/1997  Bertin et al. ........................ 365/185.05

OTHER PUBLICATIONS

"A Novel Memory Cell Using Flash Array Contactless EPROM (FACE) Technology," 1990 IEDM, pp. 90–94.
"A NAND Structured Cell With A New Programming Technology For Highly Reliable 5-V Only Flash EEPROM," 1990 Symposium on VLSI Technology, pp. 129–130.

Primary Examiner—Sara W. Crane
Attorney, Agent, or Firm—Rabin, Champagne & Lynt, P.C.

[57] ABSTRACT

A compact contactless trenched flash memory array for semiconductor EEPROM devices is disclosed. The flash memory array comprises a number of memory cell units. Each of the cell units comprises a body line, source and drain regions and a stacked gate constructed over a silicon wafer substrate. The source and drain regions are buried regions and the body line is isolated by the surrounding buried source/drain regions and trenches formed to cut deep down to the substrate of the wafer. The stacked gate includes a first polysilicon layer, an oxide-nitride-oxide configuration, a second polysilicon layer, a pad oxide layer and a nitride layer. The source and drain buried regions sandwiches the body line, and the stacked gate substantially sits directly atop the body line. The flash memory array is free from the serious problem of short channel effect.

33 Claims, 10 Drawing Sheets

COMPACT CONTACTLESS TRENCHED FLASH MEMORY CELL

FIELD OF THE INVENTION

The present invention relates in general to a memory cell configuration of high density semiconductor electrically-erasable programmable read-only memory (EEPROM) devices. In particular, the present invention relates to a compact contactless memory arrays for flash EEPROM devices. More particularly, the present invention relates to the memory cell configuration of the compact contactless trenched flash array for the flash EEPROM device that allows to eliminate the short channel effect during hot carrier programming phase of the device.

TECHNICAL BACKGROUND

Scaling down of the physical dimensions of the memory cell configuration for semiconductor flash EEPROM devices is indispensable for the upcoming next generation of high-density non-volatile memory devices. In the effort conducted for the scaling down of the basic memory cell units in these flash EEPROM devices, several configurations were proposed. For example, R. Kirisawa, S. Aritome, R. Nakauama, T. Endoh, R. Shirota and F. Masuoka proposed a NAND structure in their paper "A NAND structured cell with a new programming technology for highly reliable 5-V only flash EEPROM", 1990 Symposium on VLSI Technology, pp. 129–130. This NAND structure does need special design on source and drain regions, which suffer from band-to-band tunneling or even junction breakdown during extraction of electrons out of floating gates. This problem leads to unintentional damage on the thin oxide and difficulty in scaling the sources and drains of flash cells.

On the other hand, B. J. Woo, T. C. Ong, A. Gazio, C. Park, G. Atwood, M. Holler, S. Tam and S. Lai proposed another "FACE" structure in their paper "A novel memory cell using flash array contactless EPROM (FACE) Technology", 1990 IEDM, pp. 90–94. This basic structure, although featured as compact cells for the high-density flash EEPROM devices, does suffer significant short channel effect during the hot carrier programming phase of the device. As is well known, the short channel effect in the memory cell units will easily and likely lead to the result of device punch-through. This problem represents a serious obstacle toward the down-scaling of the device memory cells in the progress of device miniaturization as the semiconductor fabrication technology advances.

SUMMARY OF THE INVENTION

It is therefore the primary object of the present invention to provide a compact contactless trenched flash array, that has a configuration suitable for high-density memory cells, for EEPROM semiconductor devices.

It is another object of the present invention to provide a compact contactless trenched flash array for EEPROM semiconductor devices. The array has a high-density memory cell array configuration without exhibiting hot carrier programming short channel effect during the programming phase of the device.

It is still another object of the present invention to provide a compact contactless trenched flash array for EEPROM semiconductor devices. The array allows for better programming control over smaller number of individual memory cells.

To achieve the above-identified objects, the present invention provides a compact contactless trenched flash memory array for semiconductor EEPROM devices. The array comprises a number of memory cell units. Each of the cell units includes a body line, source and drain regions and a stacked gate constructed over a silicon wafer. The source and drain regions are buried regions and the body line is isolated by the surrounding buried source/drain regions and trenches cutting deep down to the substrate of the wafer. The stacked gate includes a first polysilicon layer, an oxide-nitride-oxide configuration, a second polysilicon layer, a pad oxide layer and a nitride layer. The source and drain buried regions sandwich the body line, and the stacked gate substantially sits directly atop the body line. The flash memory array of this invention is then free from the serious problems of short channel effect.

BRIEF DESCRIPTION OF THE DRAWINGS

Other objects, features and advantages of the present invention will become apparent by way of the following detailed description of the preferred but non-limiting embodiments. The description is made with reference to the accompanying drawings in which.

DETAILED DESCRIPTION OF THE PREFERRED EMBODIMENTS

For the fabrication of the compact contactless flash array for the EEPROM device in accordance with a preferred process of the present invention, the starting material may be, for example, a <100> oriented n-type wafer. The process is described in the depicted procedural steps outlined below. The structural formation of the memory array is also described step by step with reference to the drawings. Note that the dimensions of the component configuration shown in the drawing for the description of the present invention are not drawn to the exact scale. Rather, the drawings are prepared only to schematically exemplify the characteristics of the present invention, without the intention to show the precise relative dimensions therein.

Step 1

Form a P-well in the substrate of a wafer either by $BF_2$ implantation and then perform thermal drive-in, or by epitaxial growth of a p-type layer on the wafer.

Figure 1:
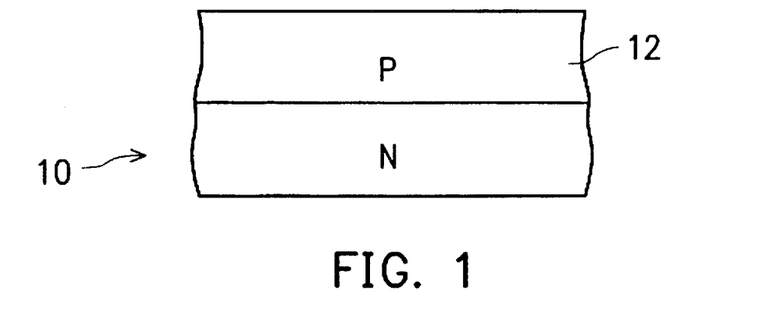
FIG. 1 is the cross-sectional view showing the silicon wafer at the completion of the formation of the P-well.

As seen in FIG. 1, a <100> n-type substrate 10 may be utilized as the basis for the construction of the memory device and is subjected to an ion implantation procedure implanting $BF_2$ ions under three energy levels of about 100/375/975 KeV. The $BF_2$ implantation procedure achieves a dose of about 5E12/cm$^2$ so as to form a P-well 12 in the substrate 10. After the formation of the P-well 12, a thermal drive-in procedure may be employed to bring the implanted material further into the depth of the substrate 10. Alternatively, however, an epitaxially grown layer with a thickness of about 8,000 to 12,000 Å, having a resistance of about 3 Ω-cm as a result of boron doping, may also be used.

Step 2

Grow a gate oxide layer for the flash array, deposit a first polysilicon layer and pattern the layers to form deep trenches down to the n-type substrate, and reoxidize the device substrate in process to seal the surface thereof.

Figure 2A:
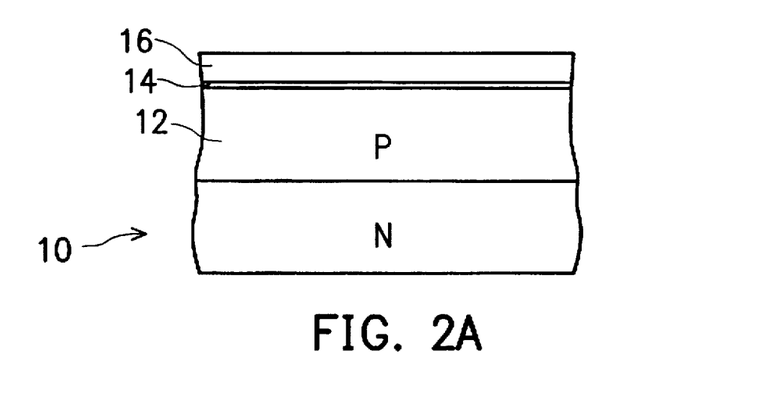
FIG. 2A is a cross-sectional view showing the formation of the first polysilicon deposition.
Figure 2B:
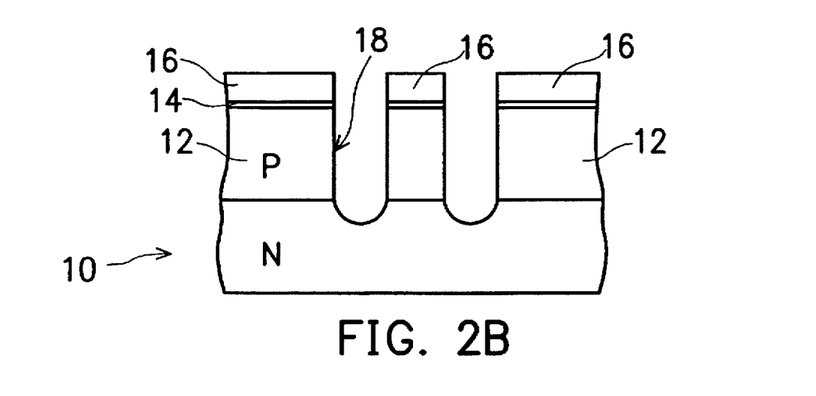
FIG. 2B is a cross-sectional view showing the formation of the deep trenches.
Figure 2C:
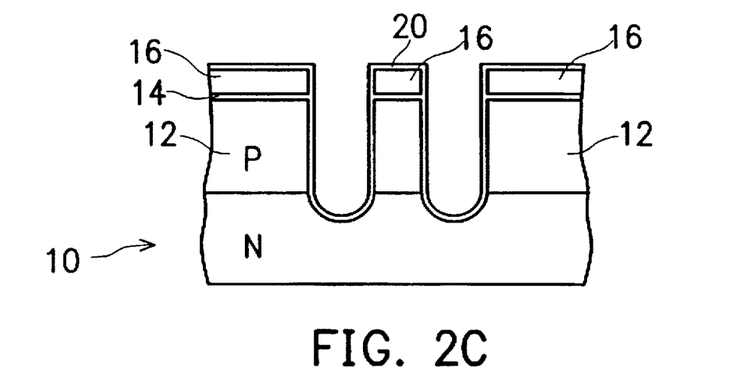
FIG. 2C is a cross-sectional view showing the formation of the sealing oxidation for the substrate.

As then seen in FIGS. 2A to 2C, a gate oxide layer 14 for the flash array cells is then grown with deep trenches 18 formed in the substrate 10. The trenches 18 cut into the depth reaching into the substrate 10. This may be achieved by first allowing a gate oxide layer 14 having a thickness of about 60 to 100 Å to be grown over the surface of the P-well 12 in the substrate 10, followed by the deposition of a first polysilicon layer 16 having a thickness of about 1,500 Å, as shown in FIG. 2A. The first polysilicon layer 16 may then be patterned in a photolithography procedure that defines the locations of the trenches 18 to be cut substantially vertically into the device substrate 10. The deep trenches 18 are then formed, as shown in FIG. 2B, with the bottoms thereof cutting into the layer of the substrate 10. To allow the bottom of a trench 18 to cut into the substrate 10, the depth of the trenches 18 is about 15,000 to 20,000 Å measured from the level of the first polysilicon layer 16. Then, in FIG. 2C, a reoxidation procedure under a temperature of about 900° to 950° C. may then be implemented to form a seal 20 having a thickness of about 100 to 200 Å to the surface of the device substrate at this stage.

Step 3

Deposit a first BPSG (borophosphosilicate glass) layer on the surface of the device in process and then reflow and etch back selectively the BPSG layer to expose the poly-I layer.

Figure 3A:
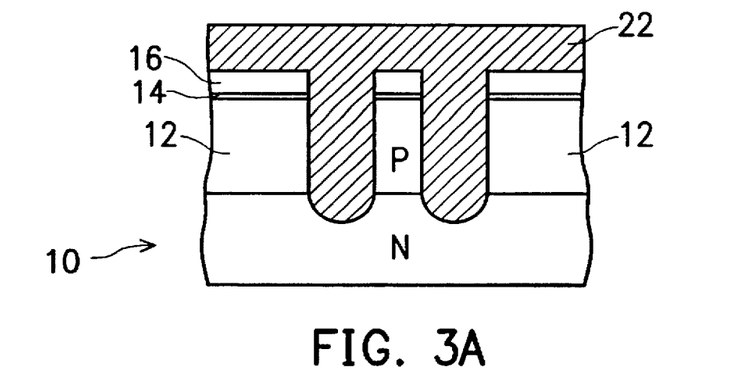
FIG. 3A is a cross-sectional view showing a layer of BPSG that covers the substrate completely and reflowed to achieve planarity.
Figure 3B:
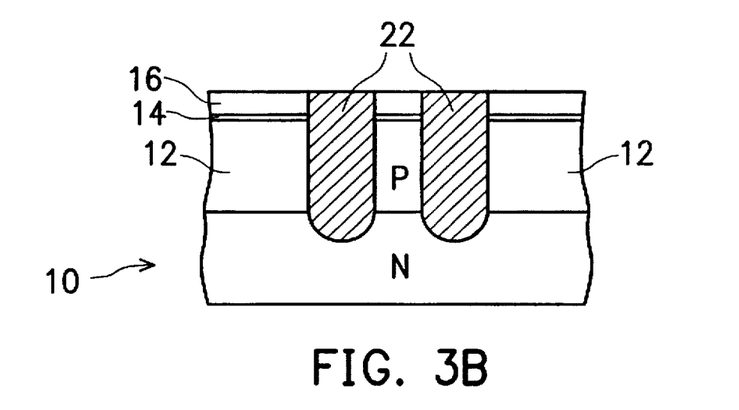
FIG. 3B is a cross-sectional view showing the BPSG layer etched back to expose the first polysilicon layers.

As seen in FIG. 3A, a layer of BPSG 22 with a thickness of about 2 to 3 μm is then deposited in, for example, a low temperature oxidation (LTO) procedure in order to cover the first polysilicon layer 16 completely, as well as filling into the trenches 18. Afterwards, the BPSG layer 22 is then reflowed to achieve planarity and etched until the first polysilicon layer 16 is exposed, as seen in FIG. 3B.

Step 4

Form an oxide-nitride-oxide (ONO) layer on the device in process, deposit a second polysilicon layer thereon with in-situ dope, then subsequently form a $WSi_x$ layer, grow a pad oxide layer, and deposit a nitride layer.

Figure 4:
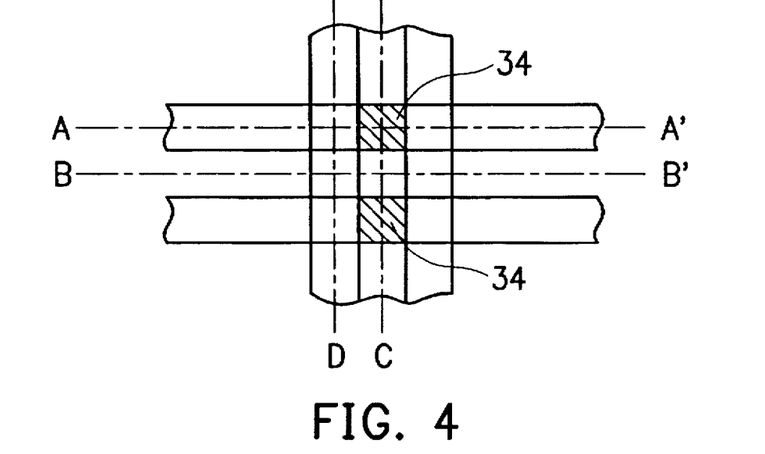
FIG. 4 is a top view of the wafer identifying the locations of the stacked gates.
Figure 4A:
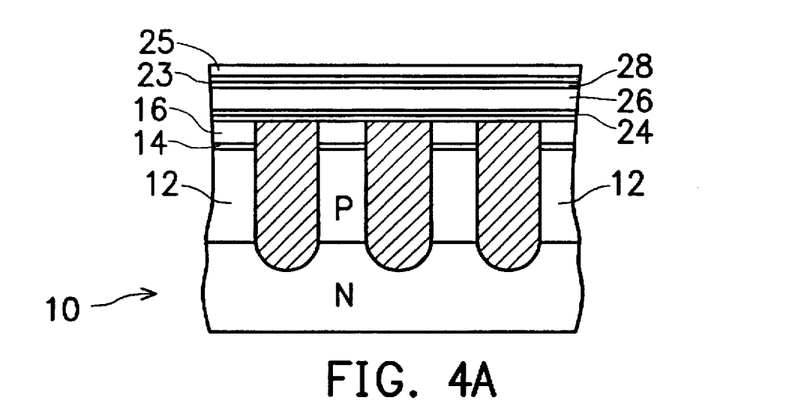
FIG. 4A is a cross-sectional view taken along the A—A line in FIG. 4 showing the formation of the stacked gate layers.

As seen in FIG. 4A, an ONO layer 24 with a thickness of about 200 to 350 Å is formed by means of, for example, first reoxidizing the exposed first polysilicon layers 16 to form 100–150 Å oxide shown in FIG. 3B, followed by the deposition of a nitride layer having a thickness of about 50 to 100 Å, and then reoxidizing the deposited nitride subsequently to form the top oxide layer having a thickness of about 50 to 100 Å for the ONO configuration 24. A second polysilicon layer 26 having a thickness of about 1,500 Å is then deposited atop the ONO configuration 24 with arsenic in-situ doping that achieves a dose of about 5E15/cm$^2$. This results in an n$^+$ second polysilicon layer 26 as shown in FIG. 4A. Then, a $WSi_x$ layer 28 is formed further atop in order to reduce the resistance of the n$^+$ second polysilicon layer 26. Afterwards, a layer of pad oxide 23 having a thickness of about 200 to 400 Å is grown, followed by the deposition of a nitride layer 25 having a thickness of about 500 to 1,000 Å. This nitride layer serves as a self-aligned mask for patterning the third polysilicon layer 46. With this layer, the third polysilicon layer 46 can be patterned without any additional photo masks. Note that the cross-sectional view of FIG. 4A is taken along the A—A line in the top view FIG. 4 for the device configuration on the wafer up to this stage. This cross-section reveals the location where the stacked gates 34 (FIG. 4) for the memory cells to be constructed subsequently.

Step 5

Define stacked gates for the flash array by patterning into the nitride, pad oxide, $WSi_x$, second polysilicon and oxide-nitride-oxide layers formed, selectively etching back the BPSG filled in the trenches, and then removing the first polysilicon and gate oxide layers.

Figure 4B:
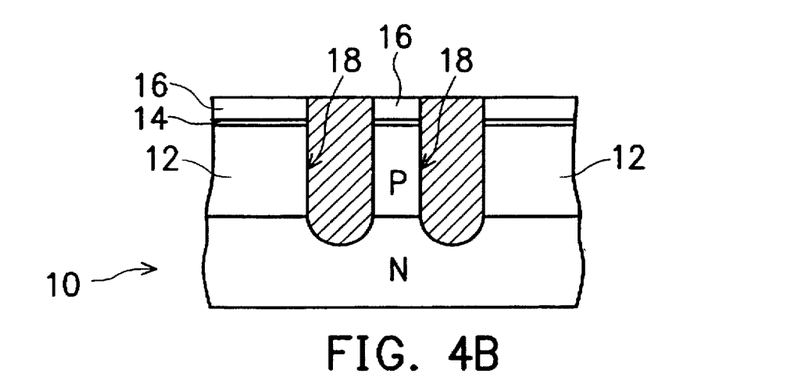
FIG. 4B is a cross-sectional view taken along the B—B line in FIG. 4 showing the etching to expose the first polysilicon layer.

Stacked gates of the fabricated flash array are then defined by, for example, plasma etching to remove unwanted portions of the nitride, pad oxide, $WSi_x$, second polysilicon, ONO and first polysilicon layers 25, 23, 28, 26, 24 and 16 (referring again to FIG. 4A) respectively, until the first polysilicon layer 16 is exposed as is shown in FIG. 4B. Note that FIG. 4B is the cross-sectional view taken along the BB' line in the top view of FIG. 4 that shows the wafer configuration at this fabrication stage. Since, as seen FIG. 4, the B—B line is away from any of the locations of the stacked gates 34 for the fabricated memory device. Therefore, all the nitride, pad oxide, $WSi_x$, second polysilicon and ONO layers 25, 23, 28, 26 and 24 respectively, that are not relevant to the areas defined by stacked gates 34, have all been removed in the plasma etching procedure described above. The BPSG layer 22 is directly exposed. The configuration of FIG. 4B is then further subjected to a selective etch back procedure against the BPSG 22 filling in the trenches 18. The extent of the portion of the BPSG 22 being removed is about 1,000 to 1,500 Å. Then, as seen in FIG. 4E, the unwanted first polysilicon layer 16 and the gate oxide layer 14 are further removed. Note here that FIG. 4E is taken along the same cross-sectional B—B line as that of FIG. 4B.

Step 6

Form $n^+$ source/drain regions for the flash array and deposit sidewall spacers for the stacked gates.

Figure 4C:
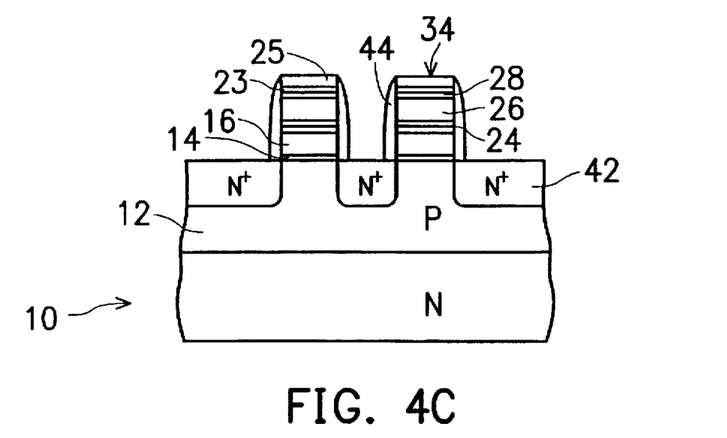
FIG. 4C is a cross-sectional view taken along the C—C line in FIG. 4 showing the formation of the sidewall spacers for the stacked gates.
Figure 4D:
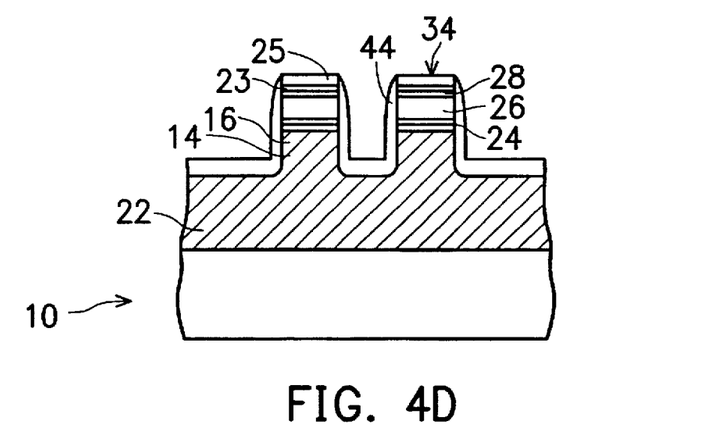
FIG. 4D is a cross-sectional view taken along the D—D line in FIG. 4 showing another cross-sectional view of the stacked gates having sidewall spacers formed.
Figure 4E:
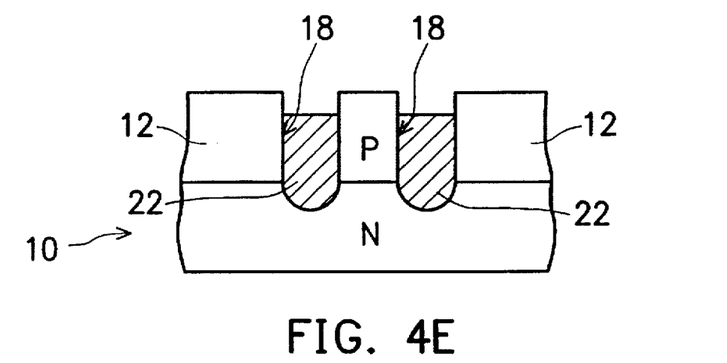
FIG. 4E is a cross-sectional view taken along the B—B line in FIG. 4 showing the BPSG is selectively etched and the first polysilicon layer removed.

As seen in FIG. 4C, which shows the cross-sectional view taken along the C—C line in the top view of FIG. 4, the source/drain regions 42 for the flash array cell units are then formed by the implantation of the arsenic ions at an energy level of about 25 KeV, achieving a dose of about $3E15/cm^2$. The arsenic implantation procedure is implemented utilizing the stacked gates 34 as a shielding mask. With simultaneous reference to FIG. 4A, FIG. 4C shows that each of the stacked gates 34 may comprise the thin oxide layer 14, the first polysilicon layer 16, the ONO configuration 24, the second polysilicon layer 26, the $WSi_x$ layer 28, the pad oxide layer 23 and the nitride layer 25 subsequently stacked above the gate oxide layer 14 that sits above the P-well 12 in the substrate 10, as is clearly seen in FIG. 4C. After the source/drain regions 42 are formed by arsenic implantation, sidewall spacers 44 may then be formed on the sidewalls of the stacked gates 34 by way of, for example, a low-temperature oxidation (LTO) procedure to form a spacer layer having a thickness of about 3,000 to 5,000 Å. The oxidized spacer layer 44 may then be subjected to, for example, a reactive ion etching (RIE) procedure to implement the etching-back until the $n^+$ source/drain regions 42 expose their surface and the sidewall spacers 44 shaped. FIG. 4D shows the cross-sectional view of the device as taken along the DD' line in the top view of FIG. 4. In a similar manner as in FIG. 4B, FIG. 4D shows the stacked layers of the stacked gates 34 in the region above the trenches 18 filled by BPSG 22.

Step 7

Deposit a third polysilicon layer followed by selective etching back to expose the stacked gate sidewall spacers, and then reduce the resistance in the formed third polysilicon layer.

Figure 5A:
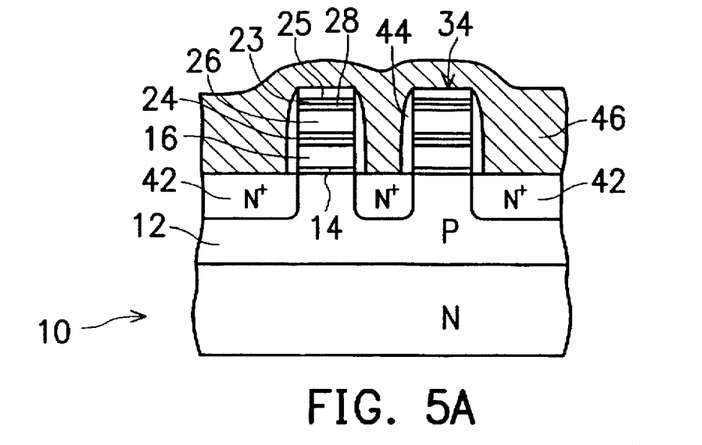
FIGS. 5A and 5B are cross-sectional views taken respectively along the A—A and BB' lines in FIG. 4 showing the deposition of the third polysilicon layer.
Figure 5B:
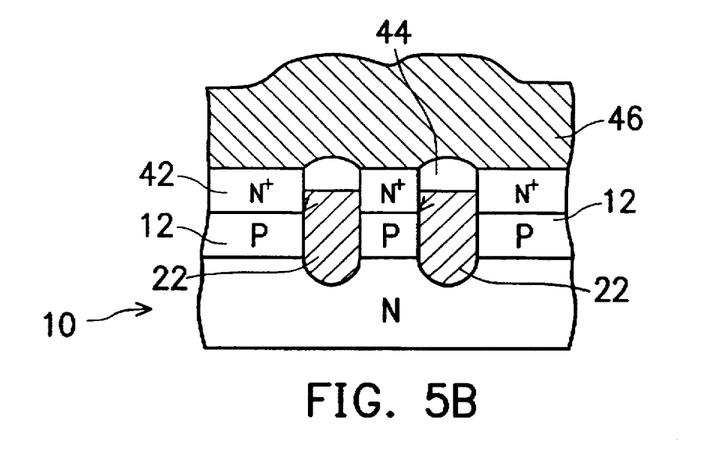
Figure 5C:
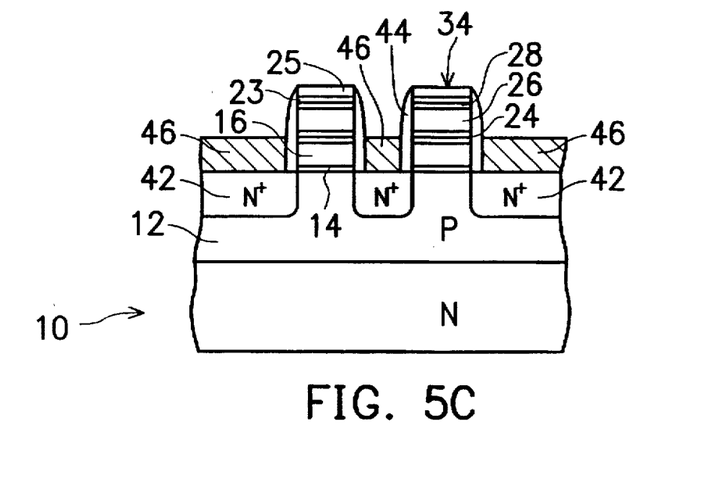
FIGS. 5C and 5D are cross-sectional views taken respectively along the C—C and D—D lines in FIG. 4 showing the third polysilicon layer being etched back and the n$^+$ regions being implanted.
Figure 5D:
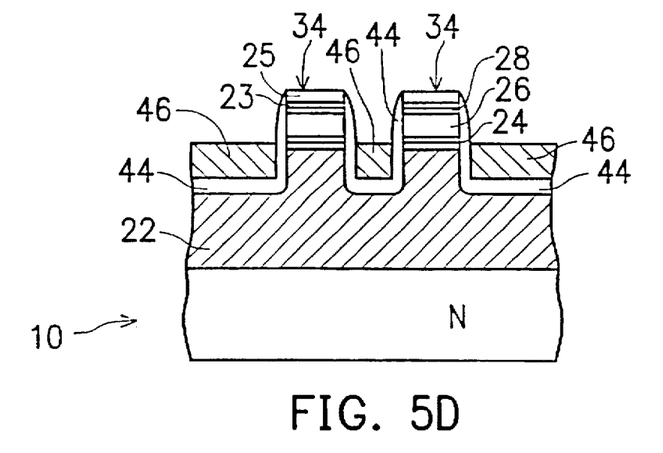

As seen in FIGS. 5A and 5B, a third polysilicon layer 46 having a thickness of about 3,000 to 4,000 Å is then deposited to cover the entire surface of the device substrate at this stage. Note that FIGS. 5A and 5B are cross-sectional views taken along the C—C and B—B lines respectively in the top view of FIG. 4. A selective etching back procedure is then implemented against the deposited third polysilicon layer 46 until the sidewall spacers 44 of the stacked gates 34 are exposed. FIGS. 5C and 5D show respectively the cross-sectional view taken along the C—C and D—D lines in the top view of FIG. 4 after the implementation of the selective etching back procedure. After the formation of the third polysilicon layers 46 as shown in FIGS. 5C and 5D, an ion implantation procedure is conducted to implant arsenic ions at an energy level of about 75 KeV to achieve a dose of about $5E15/cm^2$. The arsenic implantation serves to reduce the resistance in the third polysilicon layer 46 formed.

Step 8

Seal the edges of the stacked gates and the surface of the third polysilicon layer and then cover them with a second BPSG layer.

The edges of the stacked gates and the surface of the third polysilicon layer are sealed by a 900–950° C. thermal oxidation 47 of about 100–150 Å thickness. Then a second BPSG layer 48 having a thickness of about 12,000 to 16,000 Å is then formed by deposition to cover the stacked gates 34 completely which is subsequently reflowed and etched back to achieve planarity. Each of the formed BPSG layers that covers the corresponding stacked gates has a thickness of about 8,000 to 12,000 Å that stacks atop the corresponding nitride layers 25 of the stacked gates 34 (FIGS. 4A, 4C and 4D).

Step 9

Form contact openings for the source/drain buried lines.

Figure 6:
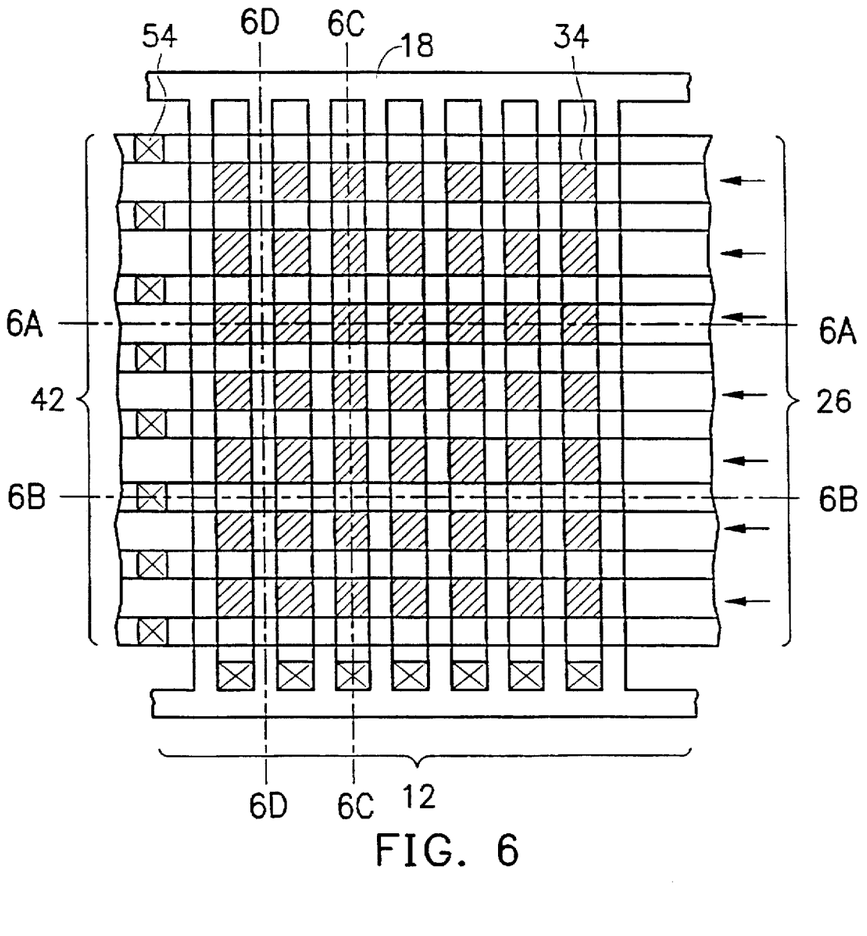
FIG. 6 schematically shows the top view of the wafer having a completely fabricated flash array for the device of the present invention.
Figure 6A:
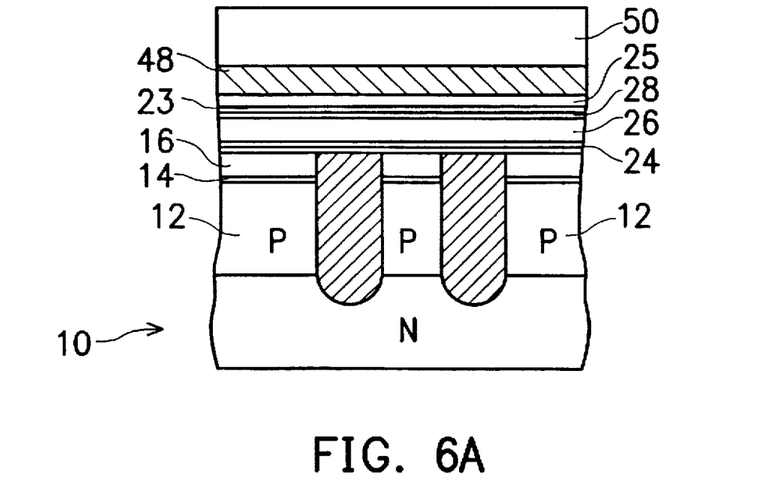
FIGS. 6A, 6B, 6C and 6D are cross-sectional views taken along the 6A—6A, 6B—6B, 6C—6C and 6D—6D lines respectively in the top view of the wafer shown in FIG. 6.
Figure 6B:
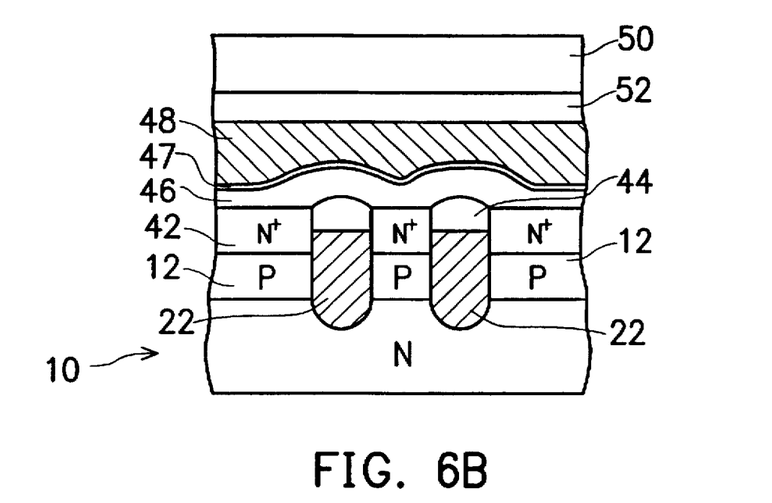
Figure 6C:
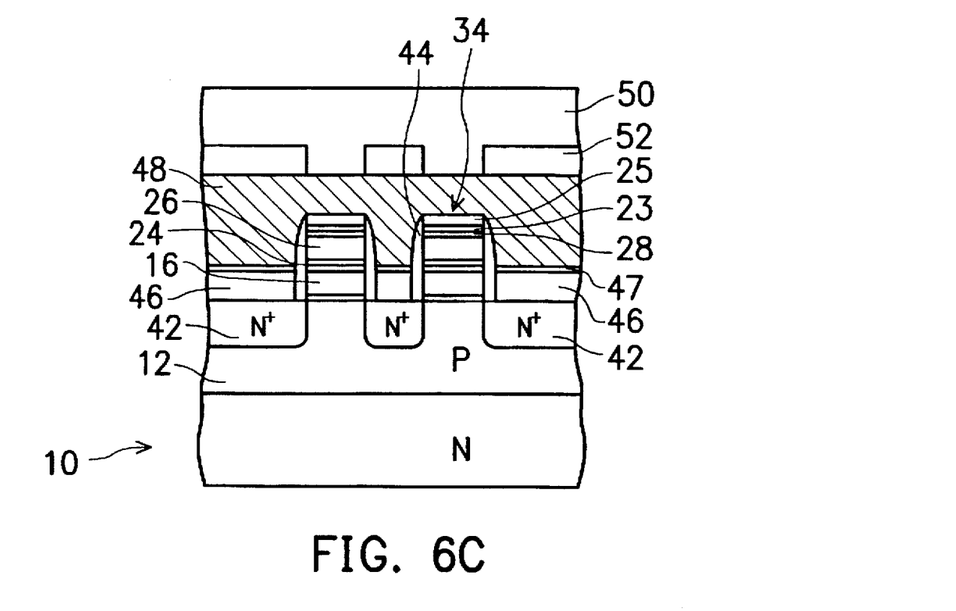
Figure 6D:
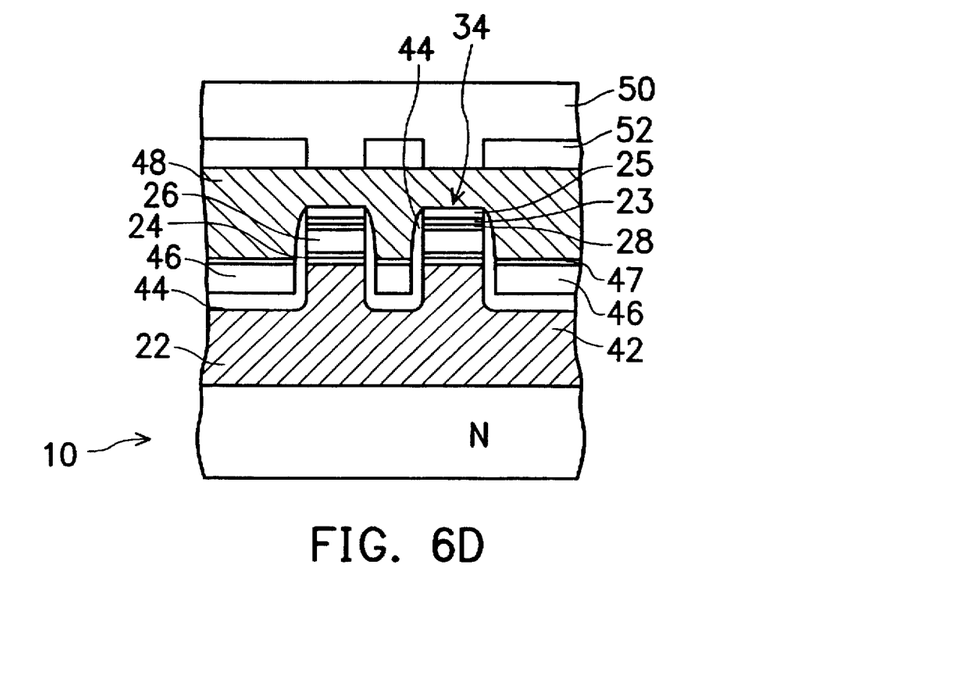

Contact openings for $n^+$ source/drain buried-lines are then opened by etching at those suggested places 54 shown in FIG. 6, for example, for every 16 or more flash cells. Thus the subsequently low resistive metal lines 52 can efficiently reduce the resistance of the third polysilicon layer 46 by connection of both parallelly. Here low resistance enhances the read current of flash and thereby improves read speed. On the other hand, body lines may have their contact openings opened around the flash memory arrays.

Step 10

Form metal lines leading into the contact openings for interconnecting the memory cells in the flash array with relevant peripheral control circuits.

FIG. 6 schematically shows the top view of the wafer having a completely fabricated flash array for the device of the present invention. In the drawings, metal lines 52 may be defined to interconnect the device memory cells with peripheral control circuit via the contact openings. Finally, the devices may be protected by the passivation of the oxide layer 50. Note that in FIG. 6, hatches are employed to show the locations of the stacked gates.

This generally concludes the process for the fabrication of the compact contactless flash array for EEPROM semiconductor devices in accordance with the preferred embodiment of the present invention. To describe the structural configuration of the compact contactless flash array of the present invention in further details, four cross-sectional views FIGS. 6A, 6B, 6C and 6D are taken along the 6A—6A, 6B—6B, 6C—6C and 6D—6D lines respectively in the top view of the fabricated wafer shown in FIG. 6. These four depicted cross-sectional views, which include the cross sections of the various characteristic portions of the flash array region, are helpful in the understanding of the characteristics of the structural configuration of the flash array of the present invention, as well as the functional characteristics it can achieve.

Figure 7:
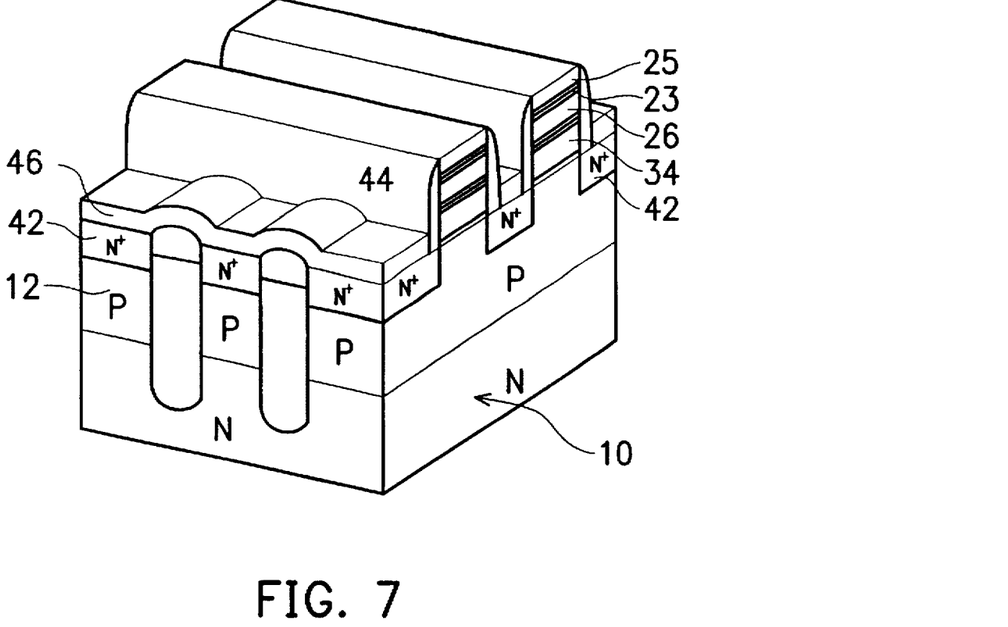
FIG. 7 is a view of the fabricated flash array of the present invention showing the special characteristics of the device structural configuration.

In addition to the cross-sectional views FIGS. 6A, 6B, 6C and 6D, a perspective view of the fabricated flash array of the present invention is also shown in FIG. 7 to further demonstrate the spatial characteristics of the device structural configuration. With simultaneous reference to the drawings of FIG. 6, FIGS. 6A, 6B, 6C and 6D and FIG. 7, it would be helpful to identify the relative spatial relationships of the components for the construction of the flash array of the present invention. The description of FIGS. 6A–6D are not elaborated herein since the structural formation of the memory array of this invention has been discussed above in connection with the process steps. FIG. 7 illustrates all the structural elements, in a perspective view; that are described before and bear the same reference numerals.

Figure 8A:
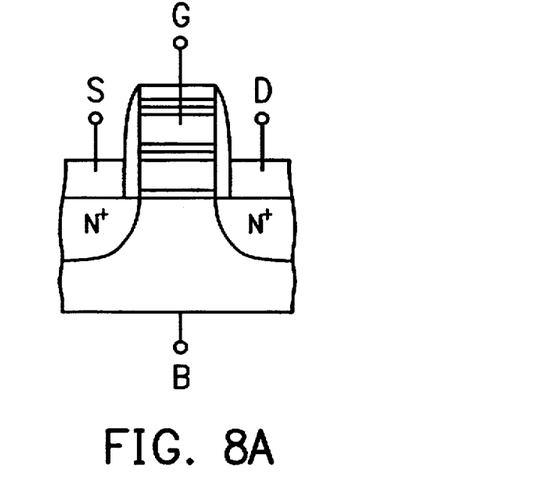
FIG. 8A schematically shows the structural configuration of one memory cell unit of the flash array of the present invention.
Figure 8B:
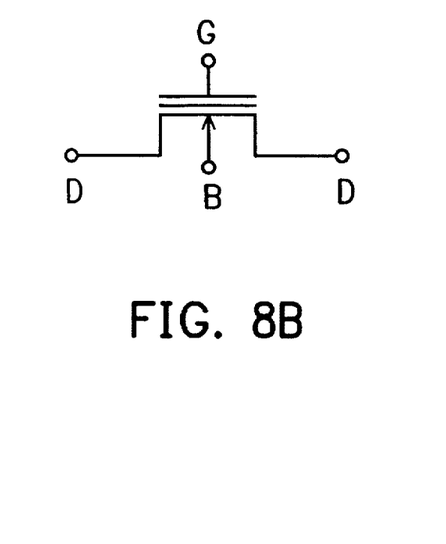
FIG. 8B shows the corresponding equivalent circuit symbol of the memory cell unit of the flash array of FIG. 8A.

Furthermore, FIG. 8A of the drawing schematically shows the structural configuration of one memory cell unit of the flash array of the present invention, while FIG. 8B shows the corresponding equivalent circuit symbol thereof As seen in FIGS. 8A and 8B, each of the fabricated memory cell unit comprises a pair of $n^+$ source/drain regions S and D respectively, a P-well body line B, and a stacked gate G that generally comprises a first polysilicon layer, an ONO configuration, a second polysilicon layer, a pad oxide layer and a nitride layer. The P-well body line B of each cell unit is surrounded and isolated by the deep trenches at both sides, and the stacked gate G directly sits atop the body line B.

Figure 9:
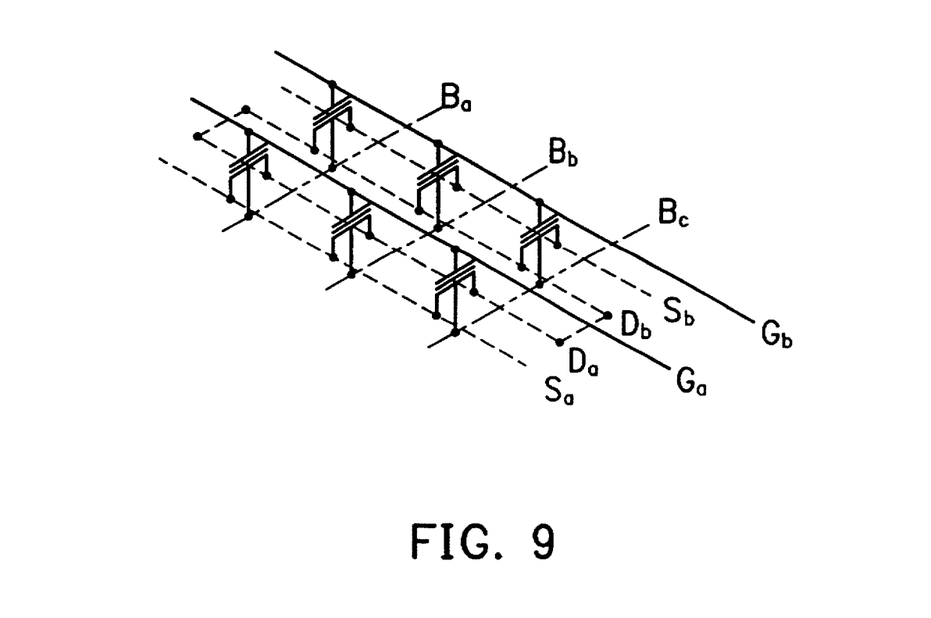
FIG. 9 schematically shows, in a perspective view, the connection of a group of memory cell units arranged in a portion of the flash array of the device of the present invention.

FIG. 9 schematically shows, in a perspective manner, the connection of a group of memory cell units arranged in a portion of the flash array of the device of the present invention. In FIG. 9, the circuit symbol of FIG. 8B has been employed to schematically exemplify the configuration of an array of memory cell units for the present invention. As noted, a set of memory cell units may be cascaded in a row (or column) that have their stacked gates G all tied together and triggered by a wordline signal $G_a$ (or, $G_b$). Similarly, another set of memory cell units may be cascaded in a column (or row) that have their P-well body lines B tied together and controlled by a body line signal $B_a$ (or, $B_b$ or $B_c$). In the arrangement shown in FIG. 9, each row (or column) of the memory cell units in the array may be directly addressed in either the read, erase or program mode via the selection of the attached metal line, such as the one exemplified by the metal line that controls the body line $B_a$ (or, $B_b$ or $B_c$) and the wordline $G_a$ (or $G_b$).

Thus, in the flash array configuration of the present invention, each of the compact cells may share its source/drain with adjacent cells. This allows for the flash memory cells of the present invention to make use of the F-N (Fowler-Nordheim) tunneling effect between the floating gate and the substrate to implement both the programming and erasing operation. Due to the use of trenches, P-well body lines of adjacent cells are isolated and work independently. By means of the double-sidewall technology, the buried $n^+$ regions are interconnected with the anisotropic-etched ploy-III. By setting the voltage difference between substrate and gate, the cell programming and erasure can be performed, as is exemplified in the table below.

In terms of the applied electric potential at the control terminals of each of the memory cell units, Table 1 below lists such a control scheme for the read, erase and program of the selected number of memory cells, assuming the activation of the wordline $G_a$ and body line $B_b$ in the array of FIG. 9.

TABLE 1

|  | Program | Erase (Sector) | Read |
|---|---|---|---|
| $G_a$ | $V_{PP1}$ (13 V) | $V_{BB2}$ (−16 V) | $V_{CG}$ (4 V) |
| $G_b$ | 0 V | 0 V | 0 V |
| $B_a$ | 0 V | 0 V | $V_{BB3}$ (−7 V) |
| $B_b$ | $V_{BB1}$ (−7 V) | 0 V | 0 V |
| $B_c$ | 0 V | 0 V | $V_{BB3}$ (−7 V) |
| $S_a$ | 0 V | $V_{PP2}$ (2 V) | 0 V |
| $D_a = D_b$ | 0 V | $V_{PP2}$ (2 V) | VD (1 V) |
| $S_b$ | 0 V | $V_{PP2}$ (2 V) | 0 V or floating |

In the table, one section may contain 256K bits or more according to the length of $n^+$ second polysilicon wordlines and that of body lines.

When compared to the flash array of the prior art, the present invention is advantageously distinguished in that the P-well body line of the memory cell units of the present invention is being isolated by the surrounding trenches and n-type substrate of the wafer. This allows the memory cells of the flash array of the present invention to be erased and programmed utilizing the body line and wordline in an F-N tunneling effect.

All prior art flash array memory cell configurations, on the other hand, would have to rely on the drain, source and wordline thereof in a hot carrier transport mode to implement the memory cell programming, although several of them may employ the source and wordline thereof in an F-N tunneling effect to implement its cell erase. In the continuous trend of the device dimensional scaling down for the improvement of memory density, the short channel effect, that is inevitable for the prior art devices which rely on hot carrier program/erase operations, constitutes a serious drawback when compared to the characteristics of the flash array of the present invention.

While the present invention has been described by way of example and in terms of preferred embodiments, it should be understood that the invention needs not be limited to the disclosed embodiments. On the contrary, it is intended to cover various modifications and similar arrangement included within the spirit and scope of the appended claims, the scope of which should be accorded the broadest interpretation so as to encompass all such modifications and similar structures.

What is claimed is:

1. A compact contactless trenched flash memory array for semiconductor EEPROM devices, said memory array comprising a plurality of memory cell units, each of said cell units including a body line, source and drain regions and a stacked gate constructed over a wafer substrate, wherein said source and drain regions are buried regions, said body line being isolated by the buried source and drain regions, said substrate and trenches formed to cut deep down to the substrate such that said buried source and drain regions, said substrate and said trenches surround said body line; and said stacked gate substantially sits directly atop said body line, and wherein said stacked gate includes a first polysilicon layer, an oxide-nitride-oxide configuration, a second polysilicon layer, a pad oxide layer and a nitride layer.

2. The compact contactless trenched flash memory array of claim 1 further comprising a P-well in a wafer substrate formed by $BF_2$ implantation and thermal drive-in of the substrate.

3. The compact contactless trenched flash memory array of claim 2, wherein said P-well in said substrate is epitaxially grown in lieu of the implanted p-well along with the thermal drive-in.

4. The compact contactless trenched flash memory array of claim 3, wherein said epitaxially grown layer has a thickness of about 8,000–12,000 Å, and is further doped with boron to have a resistance of about 3 Ω-cm.

5. The compact contactless trenched flash memory array of claim 2, wherein said implantation of $BF_2$ is conducted under an energy level of about 100/375/975 KeV to achieve a dose of about $5E12/cm^2$.

6. The compact contactless trenched flash memory array of claim 2 further comprising a gate oxide layer formed by growing over said P-well in the substrate, depositing a first polysilicon layer on the gate oxide layer and patterning said first polysilicon layer for forming deep trenches having the bottom thereof reaching down to said substrate, and then reoxidizing the processed substrate to seal a surface thereof, said gate oxide layer having a thickness of about 60 to 100 Å.

7. The compact contactless trenched flash memory array of claim 6, wherein said first polysilicon layer deposited has a thickness of about 1,500 Å.

8. The compact contactless trenched flash memory array of claim 6, wherein said first polysilicon layer is patterned in a photolithography procedure for defining locations of said trenches to be cut substantially vertically into said substrate.

9. The compact contactless trenched flash memory array of claim 6, wherein said formed trenches in said substrate has a depth of about 15,000 to 20,000 Å measured from said first polysilicon layer.

10. The compact contactless trenched flash memory array of claim 6, wherein said reoxidizing is conducted at a temperature of about 900° to 950° C. for forming a seal having a thickness of about 100 to 200 Å to the surface of said substrate.

11. The compact contactless trenched flash memory array of claim 1 further comprising a first BPSG (borophosphosilicate glass) layer deposited on said sealed substrate surface and then reflowing and etching back the first BPSG layer having a thickness of about 2 to 3 µm in a low temperature oxidation procedure for covering said first polysilicon layer completely.

12. The compact contactless trenched flash memory array of claim 11, wherein said reflowing and etching back of said first BPSG layer is performed until achieving a planarity and exposing said first polysilicon layer.

13. The compact contactless trenched flash memory array of claim 1 further comprising an ONO (oxide-nitride-oxide) layer formed on said reflowed first BPSG layer and said first polysilicon layer, a deposited second polysilicon layer formed with in-situ doping, a $WSi_x$ layer, a grown pad oxide layer, and a deposited nitride layer, wherein said ONO layer has a thickness of about 100 to 150 Å that is formed by reoxidizing said first polysilicon layer, followed by depositing a nitride layer having a thickness of about 50 to 100 Å, and then reoxidizing said deposited nitride layer to form an oxide layer having a thickness of about 50 to 100 Å subsequently.

14. The compact contactless trenched flash memory array of claim 13, wherein the deposited second polysilicon layer has a thickness of about 1,500 Å atop said ONO layer with arsenic in-situ doping that achieves a dose of about $5E15/cm^2$.

15. The compact contactless trenched flash memory array of claim 13, wherein the formed $WSi_x$ layer reduces the resistance of said second polysilicon layer.

16. The compact contactless trenched flash memory array of claim 13, wherein the grown pad oxide layer has a thickness of about 200 to 400 Å.

17. The compact contactless trenched flash memory array of claim 13, wherein the deposited nitride layer has a thickness of about 500 to 1,000 Å.

18. The compact contactless trenched flash memory array of claim 13, wherein the deposited nitride layer serves as a self-aligned shielding mask for patterning a third polysilicon layer that requires no additional photo mask.

19. The compact contactless trenched flash memory array of claim 1, wherein said stacked gates of said fabricated flash memory array is defined by plasma etching to remove unwanted portions of the nitride, pad oxide, $WSi_x$, second polysilicon, and ONO respectively until said first polysilicon layer is exposed.

20. The compact contactless trenched flash memory array of claim 1 further comprising stacked gates formed for said flash memory array by patterning into said formed nitride, pad oxide, $WSi_x$, second polysilicon, and ONO layers, selectively etching back said first BPSG layer filled in said trenches, and then removing partially said first polysilicon and gate oxide layers from the substrate after said patterning, wherein the selective etching back of said substrate is conducted against said first BPSG layer filled in said trenches to remove a portion of said first BPSG layer, said removed portion being about 1,000 to 1,500 Å.

21. The compact contactless trenched flash memory array of claim 20, wherein unwanted portion of said first polysilicon layer and gate oxide layer is removed.

22. The compact contactless trenched flash memory array of claim 1 further comprising $n^+$ source/drain regions formed in the substrate between said stacked gates and sidewall spacers deposited for said stacked gates, wherein arsenic ions are implanted at an energy level of about 25 KeV, thereby achieving a dose of about $3E15/cm^2$ utilizing said stacked gates as a shielding mask.

23. The compact contactless trenched flash memory array of claim 22, wherein the sidewall spacers are deposited on sidewalls of said stacked gates by a low-temperature oxidation procedure, said sidewall spacers having a thickness of about 3,000 to 5,000 Å.

24. The compact contactless trenched flash memory array of claim 22, wherein said sidewall spacers are subjected to a reactive ion etching procedure to implement an etching-back until said $n^+$ source/drain regions expose their surfaces and said sidewall spacers are shaped.

25. The compact contactless trenched flash memory array of claim 1 further comprising a third polysilicon layer deposited over the substrate in process, said third polysilicon layer is selectively etched back to expose said stacked gate sidewall spacers, and said formed third polysilicon layer having its resistance reduced, wherein said deposited third polysilicon layer has a thickness of about 3,000 to 4,000 Å and covers the entire surface of said substrate in process.

26. The compact contactless trenched flash memory array of claim 25, wherein said selective etching-back of said deposited third polysilicon layer is conducted until said sidewall spacers of said stacked gates are exposed.

27. The compact contactless trenched flash memory array of claim 25, wherein an ion implantation procedure to implant arsenic ions at an energy level of about 75 KeV to achieve a dose of about $5E15/cm^2$.

28. The compact contactless trenched flash memory array of claim 1, wherein edges of said stacked gates and a surface of said third polysilicon layer are sealed and the third polysilicon layer and exposed stacked gates are covered with a second BPSG layer, and wherein said edges of said stacked gates and the surface of said third polysilicon layer are sealed by an oxide layer having a thickness of about 100 to 150 Å formed by oxidation at a temperature of about 900° to 950° C.

29. The compact contactless trenched flash memory array of claim 28, wherein said second BPSG layer deposited has a thickness of about 12,000 to 16,000 Å to cover said stacked gates completely, said second BPSG layer is subsequently reflown and etched back to achieve a planarity such that said second BPSG layer having a thickness of about 8,000 to 12,000 Å that stacks atop the corresponding nitride layers of said stacked gates.

30. The compact contactless trenched flash memory array of claim 1 further comprising contact openings formed for said source/drain regions, wherein said contact openings are opened for said $n^+$ source/drain regions by etching for a plurality of flash cells.

31. The compact contactless trenched flash memory array of claim 30, wherein said contact openings are opened for said $n^+$ source/drain regions by etching for every 16 or more flash cells.

32. The compact contactless trenched flash memory array of claim 30, wherein contact openings are opened for forming body lines around said memory cells of said flash memory array.

33. The compact contactless trenched flash memory array of claim 1 further comprising metal lines leading into said contact openings for interconnecting the memory cells in said flash memory array with peripheral control circuits of said semiconductor EEPROM devices, wherein a protective passivation layer is formed atop the flash memory array.

* * * * *